(12) United States Patent
Hackl et al.

(10) Patent No.: US 10,288,664 B2
(45) Date of Patent: May 14, 2019

(54) METHODS AND DEVICES FOR DETECTING A DISCONNECTION OF A PROTECTIVE CONDUCTOR CONNECTION

(71) Applicant: Bender GmbH & Co. KG, Gruenberg (DE)

(72) Inventors: Dieter Hackl, Fernwald (DE); Harald Sellner, Gruenberg (DE)

(73) Assignee: BENDER GMBH & CO. KG, Gruenberg (DE)

(*) Notice: Subject to any disclaimer, the term of this patent is extended or adjusted under 35 U.S.C. 154(b) by 277 days.

(21) Appl. No.: 15/422,937

(22) Filed: Feb. 2, 2017

(65) Prior Publication Data

US 2017/0227593 A1 Aug. 10, 2017

(30) Foreign Application Priority Data

Feb. 10, 2016 (DE) .................. 10 2016 202 021

(51) Int. Cl.
*G01R 31/04* (2006.01)
*G01R 31/02* (2006.01)
*H02H 3/16* (2006.01)
*H02H 5/10* (2006.01)
*G01R 31/327* (2006.01)
(Continued)

(52) U.S. Cl.
CPC ......... *G01R 31/041* (2013.01); *G01R 31/025* (2013.01); *G01R 31/026* (2013.01); *G01R 31/327* (2013.01); *H02H 3/16* (2013.01); *H02H 5/105* (2013.01); *G01R 31/086* (2013.01); *H02H 3/33* (2013.01)

(58) Field of Classification Search
CPC .. G01R 31/041; G01R 31/025; G01R 31/327; G01R 31/026; G01R 31/086; H02H 5/105; H02H 3/16; H02H 3/33

USPC ......................... 324/522, 512, 500
See application file for complete search history.

(56) References Cited

U.S. PATENT DOCUMENTS

| 4,605,894 A * | 8/1986 | Cox ................. G01R 31/31924 324/537 |
| 6,192,496 B1* | 2/2001 | Lawrence .......... G01R 31/3191 324/73.1 |
| 2011/0080187 A1* | 4/2011 | Hotz .................. G01R 31/2889 324/756.02 |

FOREIGN PATENT DOCUMENTS

| DE | 198626410 | 1/1999 |
| DE | 20220276 U1 | 6/2003 |
| DE | 10315178 A1 | 10/2003 |

(Continued)

*Primary Examiner* — Giovanni Astacio-Oquendo
(74) *Attorney, Agent, or Firm* — King & Schickli, PLLC

(57) ABSTRACT

The invention relates to a method and to an electrical protection device for detecting a disconnection of a protective conductor connection with a subsystem in ungrounded and grounded power supply systems and in a grounded power supply system comprising a converter system.

The invention is based on the idea that the disconnection of the protective conductor connection with a subsystem will reduce the sum of the network leakage capacitances of the power supply system by the value of the network leakage capacitance of the subsystem. The necessary distinction between a subsystem in operation having a disconnected protective conductor connection and a shut-off subsystem is made by evaluating the current total power consumed via the power supply system. In the case of a converter system connected to the subsystem, the protective conductor disconnection is detected by examining the leakage current spectra that are characteristic of the converter system.

12 Claims, 2 Drawing Sheets

(51) Int. Cl.
  *G01R 31/08* (2006.01)
  *H02H 3/33* (2006.01)

(56) References Cited

FOREIGN PATENT DOCUMENTS

| | | |
|---|---|---|
| DE | 102012207624 A1 | 11/2013 |
| DE | 102014201044 B3 | 3/2015 |
| EP | 2006694 A1 | 1/1999 |
| EP | 2568557 | 3/2013 |
| EP | 2568560 | 3/2013 |
| EP | 2574939 A2 | 4/2013 |
| WO | WO03100938 | 12/2003 |

\* cited by examiner

METHODS AND DEVICES FOR DETECTING A DISCONNECTION OF A PROTECTIVE CONDUCTOR CONNECTION

This application claims priority to and incorporates by reference the disclosure of German Patent Application no. 10 2016 202 021.8 filed Feb. 10, 2016

TECHNICAL FIELD

The invention relates to a method and to an electrical protection device for detecting a disconnection of a protective conductor connection with a subsystem of an ungrounded power supply system.

Furthermore, the invention relates to a method and to an electrical protection device for detecting a disconnection of a protective conductor connection with a subsystem of a grounded alternating-current power supply system.

Furthermore, the invention relates to a method and to an electrical protection device for detecting a disconnection of a protective conductor connection with a subsystem of a grounded power supply system, a converter system being connected to the subsystem.

BACKGROUND

In a power supply system, as a protective measure, a protective grounding of conductive accessible parts of electrical equipment is an important part of the protective measure "protection by automatic shut-off of the power supply" as required according to standards. This is true irrespective of whether the network type is an ungrounded power supply system (French: Isolé Terre—IT network) or a grounded power supply system (French: Terre Neutre—TN network or French: Terre Terre—TT network).

Hence, the protective grounding of a subsystem of a branched power supply system via a protective conductor connection with the subsystem deserves special attention since in most cases a disconnection of the protective conductor will disable this protection. In this context, a subsystem refers to one unit of an entire power supply system, wherein the unit can be shut off. Said subsystem usually comprises one or more pieces of electrical equipment.

When a disconnection of a protective conductor connection (first fault) is joined by another fault (second fault), such as failure of the basic insulation due to short-circuiting of clearances and creep distances or due to defective insulation, there is an increased risk of electric shock.

Since the risk of this two-fault situation occurring in power supply system is not negligibly small, the use of residual current devices (RCDs) as additional protection has become the norm in grounded power supply systems.

In many industrial power supply systems, however, the use of RCDs as additional protection against electric shock is not possible because due to very large network leakage capacitances present in the power supply systems, even in the absence of an additional residual current, there is a leakage current that can be significantly higher than 30 mA and which would thus instantly trigger any RCDs present in the power supply system.

If it is impossible to use the RCD in a grounded power supply system because of excess leakage currents or if the RCD used is not suitable for protection against electric shock (designed for fire and installation protection only), there is the risk in case of a disconnected protective conductor connection and a second fault that a person operating the equipment as intended will suffer a dangerous electrical accident because the fault circuit will close via the person's body.

In contrast, when the protective conductor connection is intact, the residual current in case of failure of the basic insulation will run almost exclusively through the protective conductor back to the feeding point of the grounded power supply system. However, this will lead to very high ground-fault currents and usually also to contact voltages of dangerously high amplitude—provided the grounded power supply system is designed correctly. For this reason, a grounded power supply system has to be shut off quickly enough in case of a first fault.

The installation of converter systems in grounded power supply systems deserves special attention with regard to protective measures. The protective conductor connection with a converter system is particularly critical because insulation faults at the output of the converter system toward accessible and conductive parts of a converter-controlled drive can lead to residual currents that can exhibit not only network-frequency portions but also a fairly broad spectrum of converter-specific spectral portions from direct-current components to portions in the MHz range.

It also needs to be noted that large leakage capacitances between the output phases of the converter and the drive housing (output filter) can act as a low-impedance connection for the higher-frequency portions.

In this case, conventional type A RCDs do not offer sufficient additional protection. When a protective conductor connection is faulty, touching of the converter-controlled drive can lead to electric shock without a type A RCD recognizing it. Even the use of mixed frequency-sensitive type F RCDs will not reliably prevent the hazard from electric shock in most cases.

During normal operation, the leakage currents in the switch-frequency range of the converter (kHz range) will already be significantly higher than 30 mA in most cases; during normal operation of high-power converter drives, even the leakage-current limit of 300 mA is often exceeded. The use of an RCD—even for reasons of fire protection—is impossible in systems of this kind.

Thus, a reliable protective grounding of the accessible conductive drive components is one of the most important protective measures especially in high-power converter drives.

In an ungrounded power supply system, too, in which by definition all active parts of the power supply system are separated from the ground potential—against ground—and the connected equipment is connected to a grounding installation via a protective conductor, a two-fault situation can become dangerous when a piece of equipment is touched if the power supply system is an extensive ungrounded power supply system having a consequently large total network leakage capacitance. In this two-fault situation, the fault circuit will close via the touching person and the network leakage capacitances.

If the protective conductor connection is intact and the basic insulation is faulty, the residual current will run almost entirely through the protective conductor and through the network leakage capacitances. Even in case of a single fault in an ungrounded power supply system, this will only lead to harmless contact voltages at the equipment. For this reason, an ungrounded power supply system can continue to operate in case of a first fault.

Solutions for addressing the hazard arising from a disconnected protective conductor are known from the state of the art, but they have considerable disadvantages in some parts.

For instance, there are proposals for selective residual current detection that can distinguish between leakage currents and residual currents. However, RCDs on the basis of these ideas are unavailable because reliable functioning in 3-phase alternating-current systems could not be proved so far.

Furthermore, devices are available on the market that are supposed to allow the use of residual current devices for protection against electric shock in industrial systems as well by compensating capacitive leakage currents. However, it is not known how reliably protective means of this kind will work in widely branched industrial networks with changing complex operating states.

Finally, there are loop monitoring devices on the market that monitor a protective conductor connection directly at the equipment. In the presence of a plurality of equipment at different network branches, a corresponding number of loop monitoring devices are needed.

Therefore, the object of the present invention is to provide a method and an electrical protection device which detect in advance, in both grounded and ungrounded branched power supply systems, i.e. in power supply systems provided with units capable of being shut off (subsystems), a disconnection of a protective conductor connection with a subsystem without causing an interruption of operation. In a grounded power supply system, particular significance should be placed on the special case of a converter system connected to the subsystem.

SUMMARY

For an ungrounded power supply system, this object is attained by a method of the invention. The method is based on the idea that the disconnection of the protective conductor connection with a subsystem will reduce the sum of the network leakage capacitances of the ungrounded power supply system, i.e. the total network leakage capacitance, by the value of the network leakage capacitance of the subsystem, i.e. the partial network leakage capacitance. The necessary distinction between a subsystem in operation having a disconnected protective conductor connection and a shut-off subsystem is made by evaluating the current total power consumed via the power supply system.

In practice, shutting off a subsystem means separating the active conductors but not separating the protective conductor connection leading to the subsystem. When the subsystem is shut off, the total power of the power supply system is consequently reduced by the value of the partial power consumed by the subsystem in the active state and the total network leakage capacitance of the power supply system is reduced by the partial network leakage capacitance of the subsystem.

In contrast, when the protective conductor is disconnected, only the total network leakage capacitance of the power supply system is reduced by the partial network leakage capacitance of the subsystem without a time-correlated influence on the total load current consumption or the total power consumption of the power supply system.

Thus, starting from a known reference total network leakage capacitance applying to the fault-free power supply system, a reduction of the total network leakage capacitance characteristic of a shut-off subsystem or for a subsystem having a disconnected protective conductor can be determined by comparing the reference total network leakage capacitance to a measured current value of the total network leakage capacitance. The distinction whether there is a protective conductor disconnection or a shut-off of the subsystem in the course of normal operation is made based on a comparison between the known consumed reference total power of the power supply system when the subsystem is in operation and the total power currently consumed.

The current total network leakage capacitance and the current total power are measured and tested and, if applicable, the protective conductor disconnection is signaled continuously at presettable intervals during operation of the power supply system.

For a grounded power supply system, the object is attained by the following method of the invention.

In this case, the method is first based on the idea that, like in the ungrounded power supply system, the disconnection of the protective conductor connection with a subsystem reduces the sum of the network leakage capacitances of the grounded power supply system by the value of the network leakage capacitance of the subsystem. In the grounded power supply system, this is accompanied by a measurable reduction of the differential current of the entire grounded power supply system, i.e. of the total differential current, by the capacitive leakage current portions of the subsystem, i.e. by the partial differential current of the subsystem.

The necessary distinction between a subsystem in operation having a disconnected protective conductor connection and a shut-off subsystem is made, like in the ungrounded power supply system, by evaluating the current total power consumed via the grounded power supply system.

For a grounded power supply system to whose subsystem a converter system is connected, the object is attained by the following method of the invention.

The starting point in this constellation is a measurement of a leakage current specific to the converter system in a fault-free state of the grounded power supply system. This measurement is performed for all relevant power operating points of the converter system to be expected during normal operation.

A transformation of the temporal progression of the respective leakage current into the spectral range serves as a reference leakage current spectrum specific to this converter system and shows a shape that is characteristic of a specific power operating point of the converter when the protective conductor connection is intact.

A disconnection of the protective conductor connection with the converter system connected to the subsystem causes the partial network leakage capacitance of the subsystem to disappear and thus leads to a detectable change in the leakage current spectra.

During operation of the power supply system with the converter system connected via the subsystem, the current leakage current is continuously measured and a current leakage current spectrum corresponding to the momentary power operating point of the converter is calculated therefrom. This leakage current spectrum is compared to the corresponding reference leakage current spectrum, a divergence between the currently calculated leakage current spectrum and the corresponding reference leakage current spectrum being indicative of a disconnection of the protective conductor connection.

In another embodiment, calculating the reference leakage current spectrum specific to the converter system and calculating the current leakage current spectrums during operation of the converter system comprises calculating significant leakage-current spectral components, the significant leakage-current spectral components being assigned to the power operating points in a leaning phase during activation of the converter system.

With regard to a reduction of the calculating effort for calculating the leakage spectra, it suffices to calculate certain significant spectral components within the total leakage current spectrum. The significance of the selected leakage-current spectral components arises from the fact that a distinct (amplitude) change can be detected at these frequency points as a consequence of the disappearance of the partial network leakage capacitance of the subsystem.

In a learning phase during activation of the converter system, the significant leakage-current spectral components are assigned to the power operating points.

Advantageously, the currently calculated leakage current spectra are each tested by a comparison at points of the significant leakage-current spectral components.

Thus, it is thus no longer necessary to calculate the entire leakage current spectrum in order to test whether the currently calculated leakage current spectrum deviates from the corresponding reference leakage current spectrum; instead, the test is performed with little calculating effort on the basis of the selected significant leakage-current spectral components.

Advantageously, the reference values reference total network leakage capacitance, reference total differential current and reference leakage current spectrum are determined during first activation and immediately after a repeat test of the power supply system.

During first activation and immediately after a repeat test, it can be assumed that the power supply system, in particular the protective conductor connections, is/are in a fault-free state, allowing reliable reference values to be determined in this phase.

Alternatively or additionally to determining the reference values in the course of first activation and of the repeat test, the reference values reference total network leakage capacitance, reference total differential current and reference leakage current spectrum are determined by filtering the measured values.

By filtering, such as by way of sliding averaging, a continuous slow adjustment of the reference value to changing system conditions is achieved. Erratic changes of the current measured value in relation to the thus determined slow reference value are recognized as faulty events (disconnection of the protective conductor).

Implementing the method of the invention, the object is solved for an ungrounded power supply system by the electrical protection device of the invention according to the following description.

The electrical protection device has a device for measuring the total network leakage capacitance of the ungrounded power supply system, by means of which the current total network leakage capacitance is determined during operation of the power supply system. Moreover, this device for measuring the total network leakage capacitance is also suitable for measuring the total network leakage capacitance of the power supply system in the course of a first activation or of a repeat test.

Furthermore, the electrical protection device comprises a device for measuring a total power consumed via the ungrounded power supply system and an evaluating process unit for testing the measured total network leakage capacitance and the measured total power consumed and for signaling the disconnection of the protective conductor connection.

The device for measuring a total power consumed via the ungrounded power supply system can preferably consist of a preexisting system for determining network quality (performance quality (PQ) device).

The aforementioned devices for measuring the total network leakage capacitance, for measuring the total power and the evaluating process unit are each to be understood as functional units, which can be housed in separate measuring devices preexisting in part or which are integrated in structural units, as is described below.

In another embodiment, the device for measuring the total network leakage capacitance and an insulation monitoring device form an extended insulation monitoring device as a structural unit.

An insulation monitoring device prescribed according to the standard in the ungrounded power supply system can be advantageously extended by the device for measuring the total network leakage capacitance. In this way, the total network leakage capacitance can not only be determined within the meaning of the object at hand, but the total network leakage capacitance also be used for optimized determination of the insulation resistance value.

Advantageously, the extended insulation monitoring device, the device for measuring the total power consumed via the ungrounded power supply system and the evaluating process unit form an integrated combined device as a structural unit for detecting a protective conductor disconnection.

The use of an integrated combined device for detecting a protective conductor disconnection according to the invention simplifies activation of the electrical protection device and increases its reliability because detection, testing and evaluation do not have to take place in a subordinate control system; instead, they are carried out by an evaluating process unit that is part of the integrated combined device and specifically designed for this task.

Implementing the method of the invention, the object is solved for a grounded power supply system by an electrical protection device of the invention according to the following description.

For this purpose, the electrical protection device comprises a device for measuring a total differential current of the grounded power supply system, a device for measuring a total power consumed via the grounded power supply system, and an evaluating process unit for testing the measured total differential current and the measured total power consumed and for signaling the disconnection of the protective conductor connection.

The fact that the aforementioned devices and the evaluating process unit are each to be understood as functional units, which can be housed in separate measuring devices preexisting in part or which can be integrated in structural units, if applicable together with preexisting measuring devices, applies to the electrical protection device provided in the grounded power supply system for detecting a disconnection of a protective conductor connection as well.

Preferably, the device for measuring the total differential current, the device for measuring the total power consumed via the grounded power supply system and the evaluating process unit form an integrated combined device as a structural unit on the basis of a device for determining network quality (PQ device).

Integration on the basis of a device for determining network quality, which is present in most power supply systems anyway, simplifies the structure of the electrical protection device in terms of circuitry because the PQ device usually detects all necessary measuring values (load current or power consumption and total differential current) with sufficient precision.

Implementing the method of the invention, the object is solved for a grounded power supply systems having a converter system connected to a subsystem by an electrical protection device of the invention according to the following description.

For this purpose, the electrical protection device has a device for measuring a leakage current, a calculating unit for calculating a leakage current spectrum and an evaluating process unit for testing the calculated leakage current spectra and for signaling the disconnection of the protective conductor connection.

The device for measuring a leakage current detects a leakage current specific to the converter system for different power operating points of the converter system. Said leakage current is detected as a reference leakage current in a fault-free state of the grounded power supply system and as a current leakage current during operation of the converter system.

In the calculating unit, the temporal progression of the leakage current is converted into a leakage current spectrum, on the basis of which the evaluating process unit tests whether the currently calculated leakage current spectrum deviates from the corresponding reference leakage current spectrum.

Furthermore, the device for measuring the leakage current, the calculating unit for calculating the leakage current spectrum and the evaluating process unit form an integrated combined device as a structural unit on the basis of a device for determining network quality.

An integrated combined device offers the above-mentioned advantages of simplified activation and increased reliability of the electrical protection device and reduces the complexity of the circuitry. Preferably, an existing device for determining network quality (PQ device) offers a basis for the integrated combined device.

With the methods according to the invention and their implementation by means of the corresponding electrical protection devices, effective monitoring of the protective conductor connection becomes possible. In particular, a disconnection of a protective conductor connection with a subsystem can be detected in advance, which avoids a time-consuming and cost-incurring interruption of operation.

BRIEF DESCRIPTION OF THE DRAWINGS

Other advantageous embodiment features become apparent from the following description and from the drawing, which shows a preferred embodiment of the invention with the aid of examples. In the drawing.

DETAILED DESCRIPTION

Figure 1:
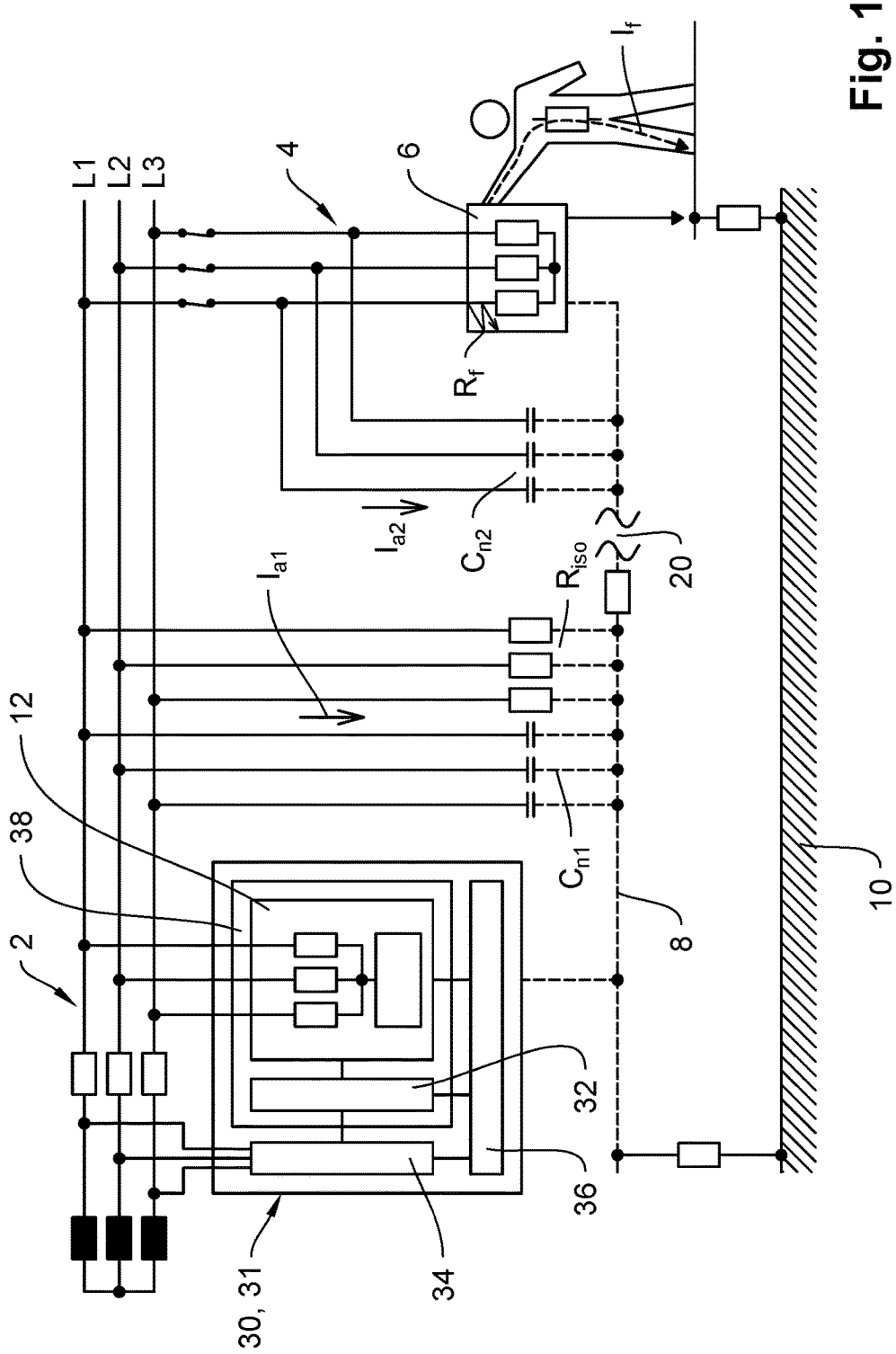
FIG. 1: shows an illustration of a protective grounding in an ungrounded power supply system with an electrical protection device according to the invention.

FIG. 1 shows a protective grounding in an ungrounded (IT) three-phase (alternating-current) power supply system 2 comprising active conductors L1, L2, L3. The power supply system 2 comprises a subsystem 4 which can be shut off and which comprises a piece of equipment 6 which is connected to a grounding system via a protective conductor connection 8, which leads to the subsystem 4. All active parts of the ungrounded power supply system 2 are separated from ground 10 by definition. The power supply system 2 is further characterized by the network leakage capacitances Cn1 of a main system and the network leakage capacitances Cn2 of the subsystem 4, the sum of the network leakage capacitances Cn1 and Cn2 being a total network leakage capacitance of the ungrounded power supply system 2 because of their parallel connection. In the fault-free state and when the subsystem 4 is switched on, the leakage currents Ia1 and Ia2 run via the network leakage capacitances Cn1 and Cn2, respectively, leakage currents Ia1 and Ia2 being proportional to the respective network leakage capacitances Cn1 and Cn2 in the present case of the alternating-current system.

An insulation monitoring device 12 connected between the active conductors L1, L2, L3 and ground 10 monitors an insulation resistance Riso of the power supply system 2 (in the case at hand, only the insulation resistance of the main system is depicted to simplify the illustration, but insulation resistances (not illustrated) of existing subsystems, which are connected in parallel, are detected as well).

In the depicted situation, a disconnection 20 (first fault) of the protective conductor connection 8 with the subsystem 4 has occurred. If now a second fault Rf happens in the equipment 6 connected to the subsystem 4 (two-fault situation) because of a defective insulation, for example, a fault current If runs through the touching person and the network leakage capacitances Cn1. In particular in extensive power supply systems 2 having large network leakage capacitances Cn1, the fault current If can reach dangerously high values.

Implementing the method according to the invention, the electrical protection device 30 according to the invention for detecting the disconnection 20 of the protective conductor connection 8 has measuring devices 32, 34 and an evaluating process unit 36. In detail, these devices are a device 32 for measuring the total network leakage capacitance of the ungrounded power supply system 2, a device 34 for measuring the total power consumed via the ungrounded power supply system 2 and an evaluating process unit 36 for testing the measured total network leakage capacitance and the measured total power consumed and for signaling the disconnection 20 of the protective conductor connection 8.

In the depicted embodiment example, the device 32 for measuring the total network leakage capacitance and the insulation monitoring device 12 form an extended insulation monitoring device 38 which, in turn, forms an integrated combined device 31 as a structural unit together with the device 34 for measuring the total power and the evaluating process unit 36.

Figure 2:
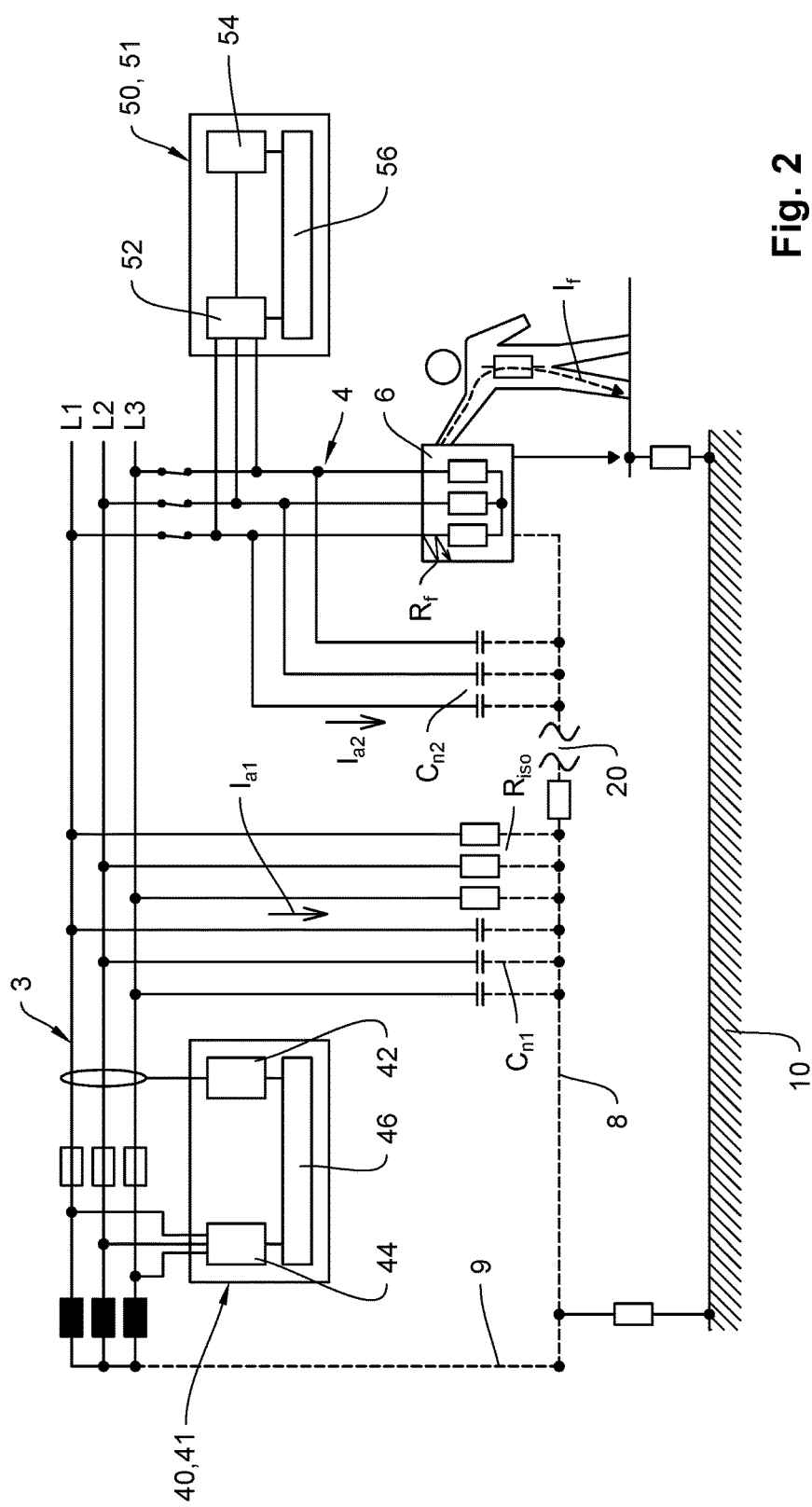
FIG. 2: shows an illustration of a protective grounding in a grounded power supply system with an electrical protection device according to the invention.

In FIG. 2, the same situation (two-fault situation) as the one for the ungrounded power supply system 2 of FIG. 1 is shown for a grounded (TN) three-phase (alternating-current) power supply system 3 having the active conductors L1, L2, L3. In contrast to the ungrounded power supply system 2 (FIG. 1), the grounded power supply system 3 has a direct ground connection 9 at its feeding point. Because of the disconnection 20 of the protective conductor connection 8, the fault current If runs entirely through the touching person.

According to the invention, a disconnection 20 of the protective conductor connection 8 is recognized through a measurement of the total differential current and the total power of the grounded power supply system 3 in connection with an evaluation of the measurement results.

For this purpose, the electrical protection device 40, in implementing the method according to the invention, has a device 42 for measuring a total differential current of the grounded power supply system 3, a device 44 for measuring a total power consumed via the grounded power supply system 3 and an evaluating process unit 46 for testing the measured total differential current and the measured total power consumed and for signaling the disconnection 20 of the protective conductor connection 8.

In the depicted embodiment example, the device 42 for measuring the total differential current, the device 44 for measuring the total power consumed and the evaluating process unit 46 form an integrated combined device 41 as a structural unit on the basis of a device for determining network quality.

In the case of a converter system connected to the subsystem (in FIG. 2 the equipment 6 can be considered such a converter system), an electrical protection device 50 for detecting a disconnection of a protective conductor connection during converter operation is arranged in the supply line of the subsystem 4.

The electrical protection device 50 for subsystems 4 having a converter system comprises a device 52 for measuring a leakage current, a calculating unit 54 for calculating a leakage current spectrum and an evaluating process unit 56 for testing the calculated leakage current spectra and for signaling the disconnection 20 of the protective conductor connection 8. The electrical protection device 50 can be implemented in the form of an integrated combined device 51 as a structural unit on the basis of a device for determining network quality.

If there are no protective conductor connections with other subsystems that need to be monitored, the electrical protection device 40 not intended for converter operation can be omitted.

The invention claimed is:

1. A method for detecting a disconnection (20) of a protective conductor connection (8) with a subsystem (4) of an ungrounded power supply system (2), comprising:
    measuring a reference total network leakage capacitance and a reference total power of the ungrounded power supply system (2) in a fault-free state of the ungrounded power supply system (2) when the subsystem (4) is shut on,
and comprising the method steps to be repeatedly executed:
    measuring a current total network leakage capacitance of the ungrounded power supply system (2),
    measuring a current total power consumed via the ungrounded power supply system (2),
    testing whether the current total network leakage capacitance is reduced by a partial network leakage capacitance of the subsystem (4) compared to the reference total network leakage capacitance,
    testing whether the current total power consumed via the ungrounded power supply system (2) is reduced by a partial power consumed by the sub system (4) in the shut-on state compared to the reference total power,
    signaling that there is a disconnection (20) of the protective conductor connection (8) if the tests reveal that the current total network leakage capacitance is reduced and the current total power is not reduced.

2. A method for detecting a disconnection (20) of a protective conductor connection (8) with a subsystem (4) of a grounded power supply system (3), comprising:
    measuring a reference total differential current and a reference total power of the grounded power supply system (3) in a fault-free state of the grounded power supply system (3) when the subsystem (4) is shut on,
and comprising the method steps to be repeatedly executed:
    measuring a current total differential current of the grounded power supply system (3),
    measuring a current total power consumed via the grounded power supply system (3),
    testing whether the current total differential current has dropped by a partial differential current of the subsystem (4) compared to the reference total differential current,
    testing whether the current total power consumed via the grounded power supply system (3) is reduced by a partial power consumed by the sub system (4) in the shut-on state compared to the reference total power,
    signaling that there is a disconnection (20) of the protective conductor connection (8) if the tests reveal that the current total differential current is reduced and the current total power is not reduced.

3. A method for detecting a disconnection (20) of a protective conductor connection (8) with a subsystem (4) of a grounded power supply system (3), comprising a converter system connected to the subsystem (4), comprising the method steps to be executed during activation of the converter system:
    measuring a leakage current specific to the converter system for each one of different power operating points of the converter system in a fault-free state of the grounded power supply system (3),
    calculating a reference leakage current spectrum of the respective leakage current specific to the converter system, and comprising the method steps to be repeatedly executed during operation of the converter system:
    measuring a current leakage current for each of the different power operating points of the converter system,
    calculating a current leakage-current spectrum of the respective current leakage current,
    testing whether the currently calculated leakage current spectrum deviates from the corresponding reference leakage current spectrum,
    signaling that there is a disconnection (20) of the protective conductor connection (8) if the test reveals that the currently calculated leakage current spectrum deviates from the corresponding reference leakage current spectrum.

4. The method according to claim 3,
characterized in that
calculating the reference leakage current spectrum specific to the converter system and calculating the current leakage current spectrum during operation of the converter system comprises calculating significant leakage-current spectral components, the significant leakage-current spectral components being assigned to the power operating points in a learning phase during activation of the converter system.

5. The method according to claim 4,
characterized in that the currently calculated leakage current spectra are each tested by a comparison at points of the significant leakage-current spectral components.

6. An electrical protection device (30) for detecting a disconnection (20) of a protective conductor connection (8) with a subsystem (4) of an ungrounded power supply system (2), characterized by a device (32) for measuring a total network leakage capacitance of the ungrounded power supply system (2), by a device (34) for measuring a total power consumed via the ungrounded power supply system (2) and by an evaluating process unit (36) for testing the measured total network leakage capacitance and the measured total power consumed and for signaling the disconnection (20) of the protective conductor connection (8).

7. The electrical protection device (30) according to claim 6, characterized in that the device (32) for measuring the total network leakage capacitance and an insulation monitoring device (12) form an extended insulation monitoring device (38) as a structural unit.

8. The electrical protection device (30) according to claim 7, characterized in that the extended insulation monitoring device (38), the device (34) for measuring the total power consumed via the ungrounded power supply system and the evaluating process unit (36) form an integrated combined device (31) as a structural unit for detecting a protective conductor disconnection (20).

9. An electrical protection device (40) for detecting a disconnection (20) of a protective conductor connection (8) with a subsystem (4) of a grounded power supply system (3), characterized by a device (42) for measuring a total differential current of the grounded power supply system (3), by a device (44) for measuring a total power consumed via the grounded power supply system (3) and by an evaluating process unit (46) for testing the measured total differential current and the measured total power consumed and for signaling the disconnection (20) of the protective conductor connection (8).

10. The electrical protection device (40) according to claim 9, characterized in that the device (42) for measuring the total differential current, the device (44) for measuring the total power consumed via the grounded power supply system and the evaluating process unit (46) form an integrated combined device (41) as a structural unit on the basis of a device for determining network quality.

11. An electrical protection device (50) for detecting a disconnection (20) of a protective conductor connection (8) with a subsystem (4) of a grounded power supply system (3), comprising a converter system connected to the subsystem (4), characterized by a device (52) for measuring a leakage current, a calculating unit (54) for calculating a leakage current spectrum and by an evaluating process unit (56) for testing the calculated leakage current spectra and for signaling the disconnection (20) of the protective conductor connection (8).

12. The electrical protection device (50) according to claim 11, characterized in that the device (52) for measuring the leakage current, the calculating unit (54) for calculating the leakage current spectrum and the evaluating process unit (56) form an integrated combined device (51) as a structural unit on the basis of a device for determining network quality.

* * * * *